United States Patent [19]

Kim

[11] Patent Number: 5,279,989
[45] Date of Patent: Jan. 18, 1994

[54] METHOD FOR FORMING MINIATURE CONTACTS OF HIGHLY INTEGRATED SEMICONDUCTOR DEVICES

[75] Inventor: Jeong Kim, Tongdaemun, Rep. of Korea

[73] Assignee: Hyundai Electronics Industries Co., Ltd., Kyoungkido, Rep. of Korea

[21] Appl. No.: 22,666

[22] Filed: Mar. 1, 1993

[30] Foreign Application Priority Data

Feb. 29, 1992 [KR] Rep. of Korea ............... 1992-3279

[51] Int. Cl.⁵ ................................... H01L 21/31
[52] U.S. Cl. ............................ 437/195; 437/52; 437/59; 437/193; 437/228; 156/644
[58] Field of Search ............... 156/644; 437/228, 195, 437/978, 56, 59, 52, 193

[56] References Cited

U.S. PATENT DOCUMENTS

| | | | |
|---|---|---|---|
| 4,996,167 | 2/1991 | Chen | 437/40 |
| 5,010,039 | 4/1991 | Ku et al. | 437/228 |
| 5,043,298 | 8/1991 | Yamada et al. | 437/52 |

FOREIGN PATENT DOCUMENTS 61-230324 10/1986 Japan ................... 437/203

OTHER PUBLICATIONS

Auer, S., et al., "Limitations of Trench ... ", Ext. Abs. 22nd (1990 International) Conf. Solid State Devices and Materials, Senuai, 1990, pp. 401-404.

Primary Examiner—T. N. Quach
Attorney, Agent, or Firm—Darby & Darby

[57] ABSTRACT

A method of forming miniature contacts over the sources and drains of the MOSFETs of a highly integrated semiconductor device which includes the steps of: applying a thick insulation layer over the MOSFETs, applying a first polysilicon layer, a subsequent insulation layer and a photoresist film having predetermined thickness over the original thick insulation layer. The photoresist film is removed at its portions disposed above the sources and drains to form a photoresist film pattern and the subsequent insulation layer is etched in order to form an insulation pattern. The first polysilicon layer is etched using the insulation layer pattern as a mask, in order to form a first polysilicon layer pattern. The insulation layer pattern is removed and the thick insulation layer is etched using the first polysilicon layer pattern as a mask. A base insulation layer is etched, thus forming contact holes through which the sources and drains are exposed. Subsequently, a second polysilicon layer with a smooth upper surface is deposited over first polysilicon layer pattern and the contact holes, and a predetermined thickness portion of the second polysilicon layer and the first polysilicon layer pattern are removed thus form contact pads respectively connected to the sources and drains. Conductive layers can then be applied to the contact pads for predetermined electrodes or wirings.

6 Claims, 3 Drawing Sheets

METHOD FOR FORMING MINIATURE CONTACTS OF HIGHLY INTEGRATED SEMICONDUCTOR DEVICES

BACKGROUND OF THE INVENTION

1. Field of the Invention

The present invention relates to a method for forming miniature contacts of highly integrated semiconductor devices, and more particularly to a method for forming miniature contacts of highly integrated semiconductor devices capable of being applied to DRAMs, SRAMs and ASICs.

2. Description of the Prior Art

An increase in the integration degree of highly integrated devices results in a decrease in the area per cell. Such a decrease in the area per cell also results in a decrease in design rule and a decrease in space between neighboring lines. As a result, it is required to use a method for forming a direct contact between lines.

As a conventional contact forming method, a method for forming contacts in a self-aligned manner has been used. However, this method encounters a difficulty in performing an etching step using a contact mask, since the aspect ratio upon etching contacts becomes high at a severe topology. Moreover, this method involves problems of short circuits between word and bit lines and between and the word or bit line and a storage capacity electrode, other short circuits of lines caused by terminals, a poor step coverage, and an increase in resistance. Consequently, it is difficult to obtain a process margin in manufacture of semiconductor devices.

SUMMARY OF THE INVENTION

Therefore, an object of the invention is to eliminate the above-mentioned problems encountered in the prior arts and to provide a method for forming miniature contacts of highly integrated semiconductor devices with a topology, capable of forming contact pads with a width smaller than the minimum width able to be obtained by use of a masking process, each of the contact pads having an upper surface flush with a previously formed smoothing insulation layer and being connected with predetermined wirings or electrodes.

In accordance with the present invention, this object can be accomplished by providing a method for forming contacts of a highly integrated semiconductor device comprising the steps of forming over a silicon substrate an element isolation oxide film, a gate oxide film, and a plurality of MOSFETs each including gate electrodes, a source and a drain, forming a first insulation layer over the gate electrodes, removing partially the first insulation layer at its portions disposed over the sources and drains to form contact holes, and forming a conductive layer in contact with the sources and drains exposed through the contact holes, the method comprising the further step of forming miniature contacts over the sources and drains, said further step comprising the steps of: coating thick a second insulation layer as a smoothing layer over the first insulation layer including the MOSFETs and coating over the second insulation layer a first polysilicon layer, a third insulation layer and a photoresist film having predetermined thicknesses, in this order; removing the photoresist film at its portions disposed above the sources and drains to form a photoresist film pattern and etching the third insulation layer at its portions exposed through the removed portions of the photoresist film to form a third insulation layer pattern; removing the photoresist film pattern and forming spacers of a fourth insulation layer on side walls of the third insulation layer pattern; etching the first polysilicon layer at its portions exposed through the removed portions of the third insulation layer, under a condition of using both the third insulation layer pattern and the fourth insulation layer spacers as a mask, to form a first polysilicon layer pattern; removing the third-insulation layer pattern and the fourth insulation layer spacers, etching the second insulation layer at its portion exposed through the removed third insulation layer pattern and fourth insulation layer spacers, under a condition of using the first polysilicon layer pattern as a mask, and etching the first insulation layer at its portion exposed through the etched portions of the second insulation layer, to form contact holes through which the sources and drains are exposed; depositing over the contact holes and the first polysilicon layer pattern a second polysilicon layer with a smoothing upper surface and removing a predetermined thickness portion of the second polysilicon layer and the first polysilicon layer pattern to form contact pads respectively connected to the sources and drains; and contacting conductive layers for predetermined electrodes or wirings to the contact pads.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention will now be described in conjunction with manufacture of a DRAM cell, although it is not limited thereto.

Figure 1:
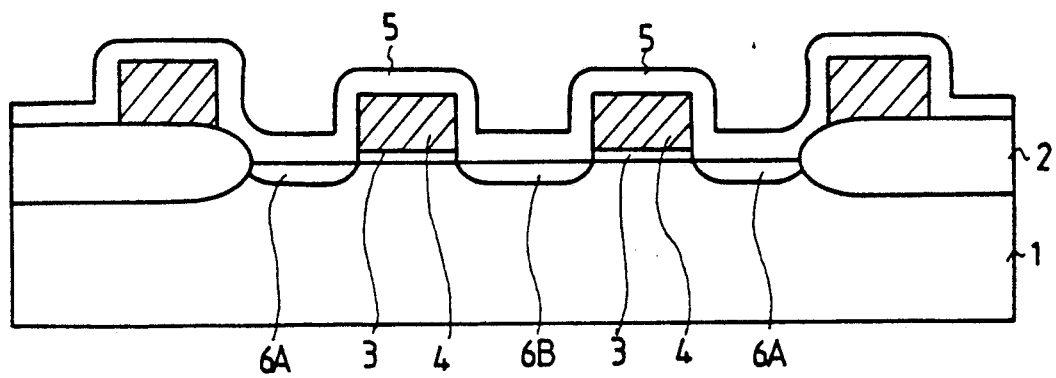
FIGS. 1, 2, 3, 4, 5, 6, 7, 8, and 9 are schematic sectional views illustrating a method for forming miniature contacts, which method is applied to manufacture of a DRAM cell.

Referring to FIG. 1, a silicon substrate 1 is shown to have an element isolation oxide film 2, a gate oxide film 3, gate electrodes 4, a first oxide layer 5 as a word line spacer and source and drain 6A and 6B. Formations of these elements are well-known by those skilled in the art and thus detailed description thereof will be omitted.

Figure 2:
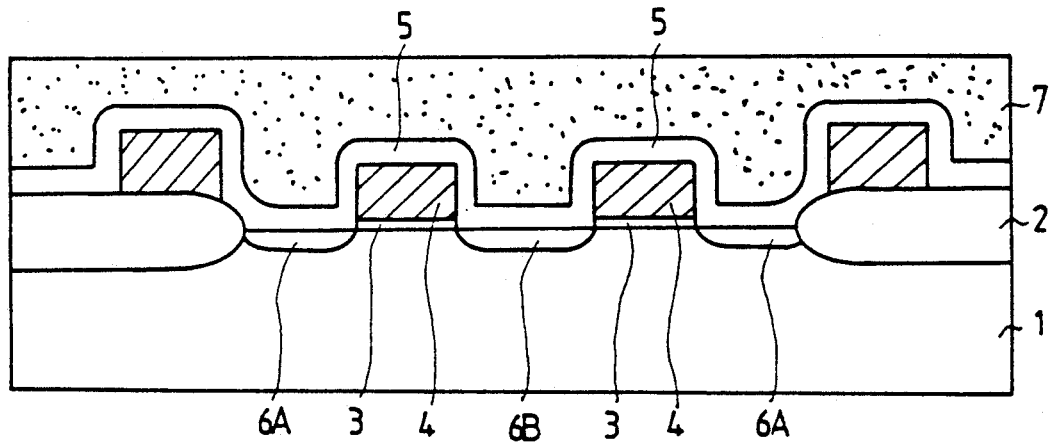

Thereafter, a smoothing step is carried out, as shown in FIG. 2. That is, a second oxide layer 7 as a smoothing layer is thick coated over the exposed upper surface of the structure shown in FIG. 1, so as to provide a smoothed upper surface on the structure.

Figure 3:
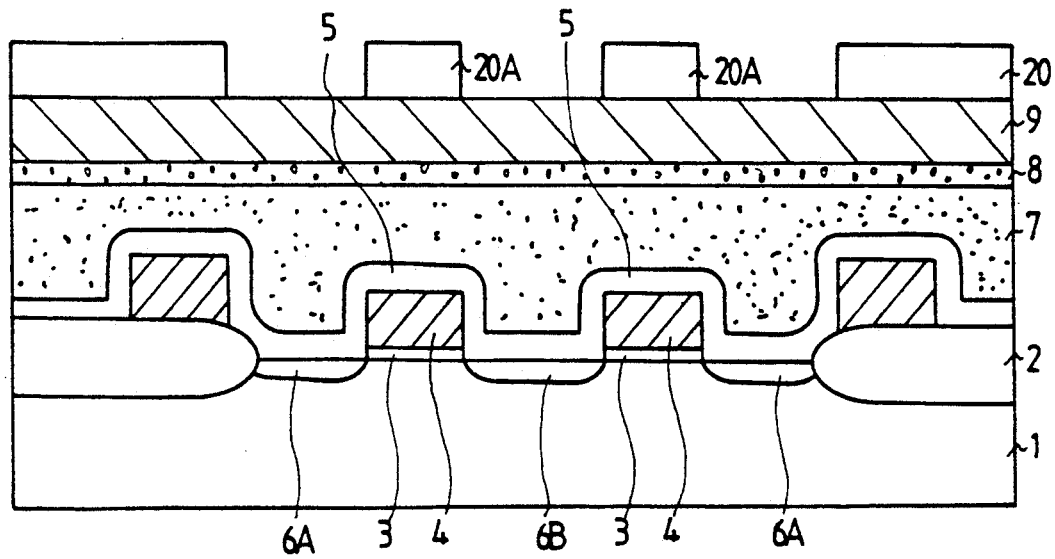

Over the upper surface of the second oxide layer 7 as the smoothing layer are deposited a first polysilicon layer 8, a third oxide layer 9 and a photoresist film 20 having predetermined thicknesses, in this order, as shown in FIG. 3. Then, a step for forming a mask is carried out, which mask is adapted to be used for forming contacts for storage capacity electrodes and bit line. The mask forming step is achieved by removing predetermined portions of the photoresist film 20 to form a photoresist film pattern 20A. At this time, the oxide layer 9 is partially exposed through the removed portions of photoresist film 20.

Figure 4:
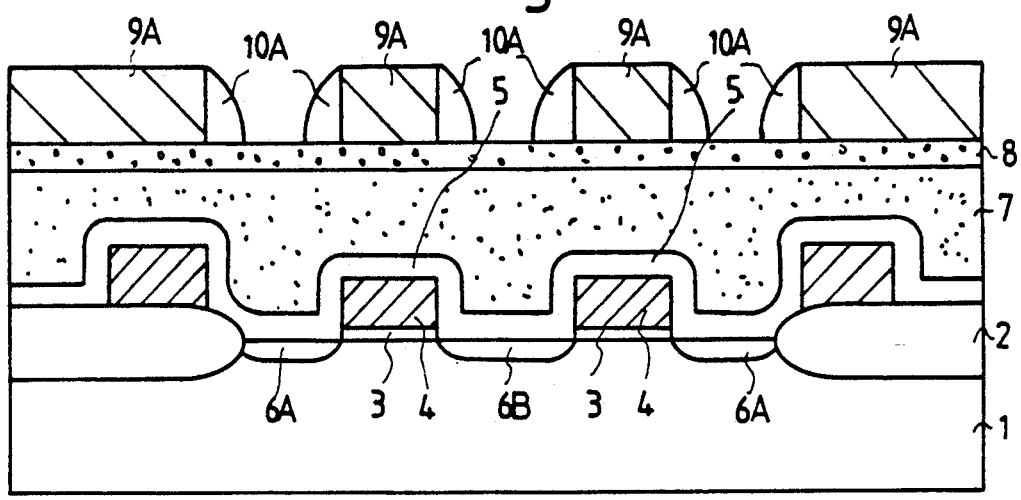

As shown in FIG. 4, a third oxide layer pattern 9A is then formed using the photoresist film pattern 20A. That is, the exposed portions of third oxide layer 9 is etched using the photoresist film pattern 20A so that the remaining portions of third oxide layer 9 forms the third-oxide layer pattern 9A. At this time, the portions of first polysilicon layer 8 disposed beneath the etched portions of third oxide layer 9 is exposed. Thereafter, the photoresist film pattern 20A is removed. Over the resultant entire exposed upper surface, a fourth oxide layer 10 is coated which is adapted to totally control the size of a contact. The fourth oxide layer 10 is then blanket-etched, so as to form a fourth oxide layer spacer 10A on each side wall of each portion of the third oxide layer pattern 9A. The fourth oxide layer spacers 10A serve to reduce the width of a contact hole which will be subsequently formed.

Figure 5:
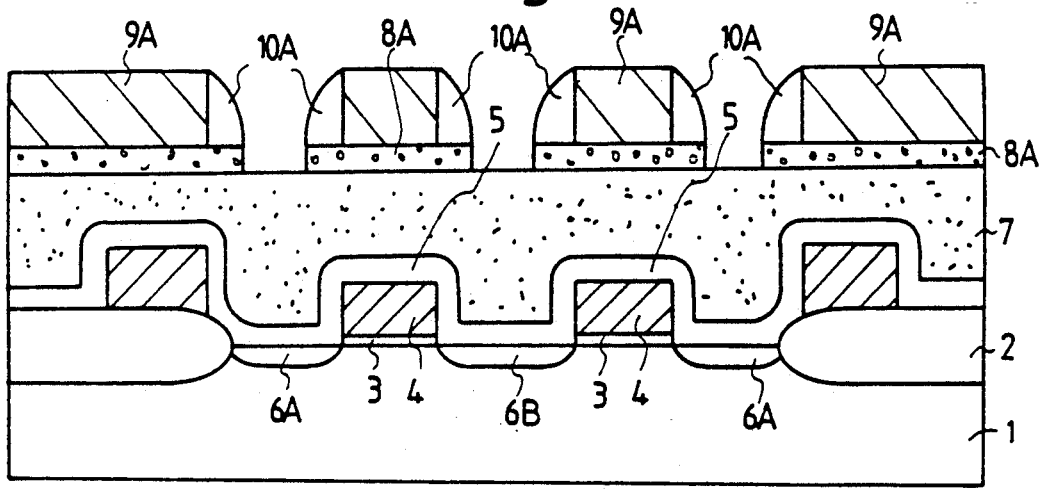

Using the third oxide layer pattern 9A and the fourth oxide layer spacers 10A as a mask layer, the exposed portions of the first polysilicon layer 8 is etched to form a first polysilicon layer pattern 8A, as shown in FIG. 5.

Figure 6:
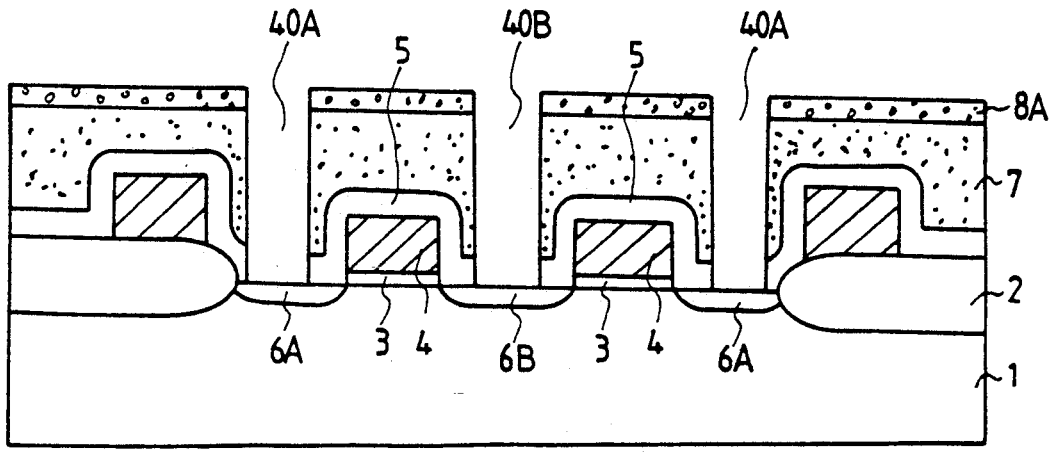

After the formation of the first polysilicon layer pattern 8A, the third oxide layer pattern 9A and the fourth oxide layer spacer 10A are removed using a blanket etching process, as shown in FIG. 6. Thereafter, the first polysilicon layer pattern 8A is used as a mask to etch the second oxide layer 7 and the first oxide layer 5, in this order. By this etching step, the source 6A and the drain 6B are exposed while contact holes 40A and 40B for the storage capacity electrodes and bit line are formed.

Figure 7:
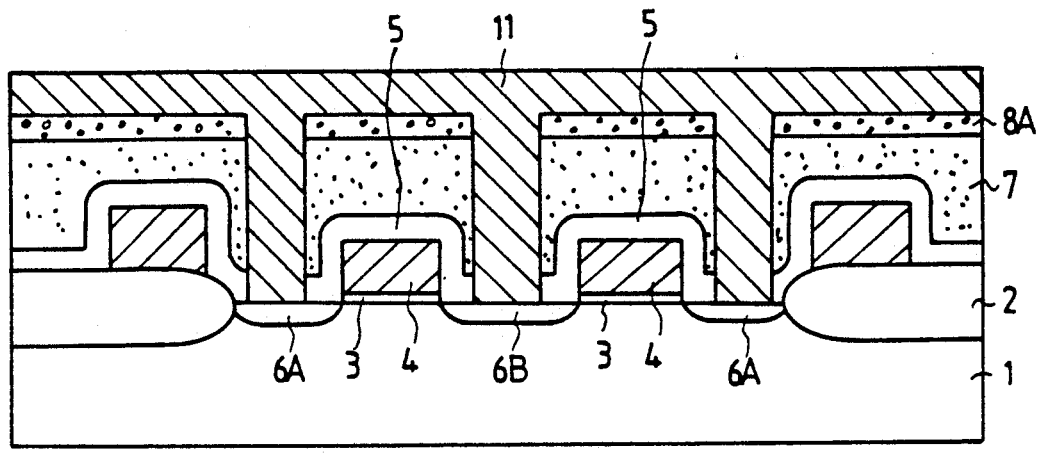

Over the resultant entire exposed upper surface of the structure including the contact holes 40A and 40B for the storage capacity electrodes and bit line as shown in FIG. 6, a second polysilicon layer 11 as a contact pad is deposited to have a smoothed surface on the first polysilicon layer pattern 8A, as shown in FIG. 7.

Figure 8:
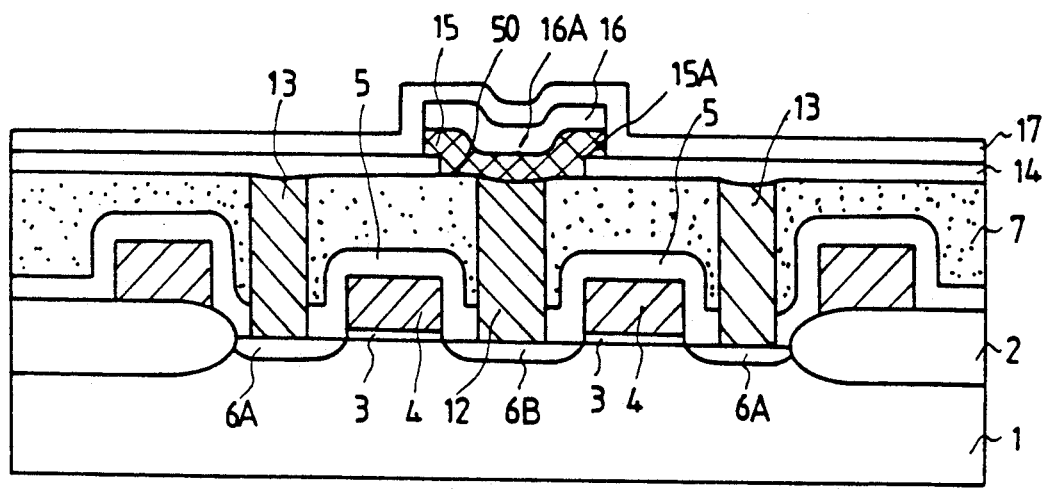

Thereafter, the second polysilicon layer 11 and the first polysilicon layer pattern 8A disposed beneath the second polysilicon layer 11 are etched back until the upper surface of second oxide layer 7 is exposed, as shown in FIG. 8. The second polysilicon layer 11 remains partially at its portions filling the contact holes 40A and 40B, so as to form contact pads 12 and 13 for the bit line and storage capacity electrodes. The contact pads 12 and 13 have upper surface flush with the upper surface of second oxide layer 7. A fifth oxide layer 14 as an internal insulation layer is then coated to a predetermined thickness over the resultant entire exposed upper surface. Using a bit line contact mask, the fifth oxide layer 14 is selectively removed at its portion disposed over the bit line contact pad 12, so as to form a window 50. Over the resultant entire exposed upper surface is then deposited a polycide layer 15 for the bit line and a sixth oxide layer 16 as an insulation layer, in this order. Using a bit line mask, respective predetermined portions of the sixth oxide layer 16 and polycide layer 15 are removed, so as to form a bit line 15A and a sixth oxide layer pattern 16A. Subsequently, a seventh oxide layer 17 is coated over the entire exposed upper surface of the resultant structure.

Figure 9:
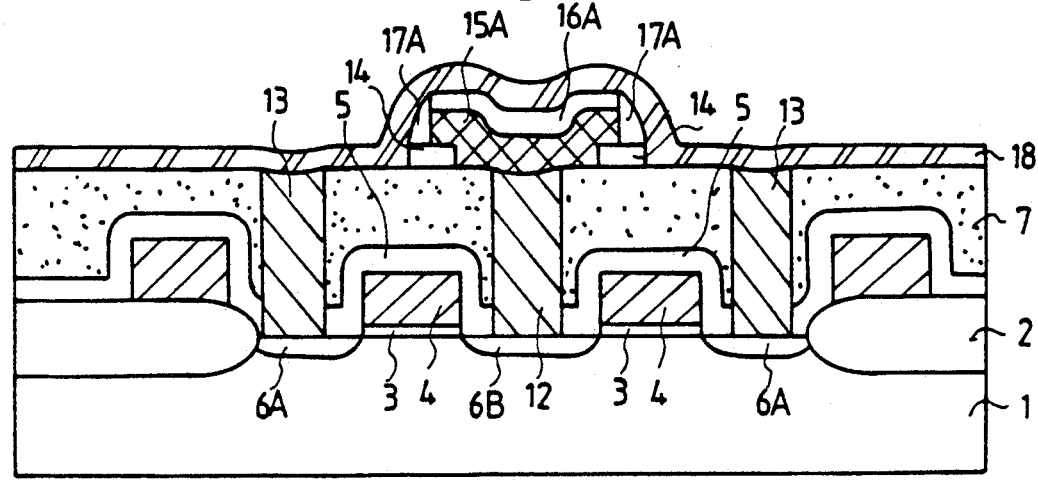

As shown in FIG. 9, the seventh oxide layer 17 is then subjected to a blanket etching so that seventh oxide layer spacers 17A are formed on side walls of the bit line 15A and sixth oxide layer pattern 16A. Thereafter, exposed portions of the fifth oxide layer 14 are removed, to expose the second oxide layer 7 and the storage capacity electrode contact pads 13 disposed therebeneath. Over the entire exposed upper surface of the resultant structure, a third polysilicon layer 18 for the storage capacity electrodes is formed to a predetermined thickness.

Although not shown in the drawings, the obtained structure is then subjected to subsequent processing steps in a conventional manner. The subsequent processing steps are adapted to form storage capacity electrodes connected with the storage capacity electrode contact pads by use of a storage capacity electrode mask and form a dielectric film and a plate electrode over the storage capacity electrodes, so as to produce a semiconductor capacitor.

As apparent from the above description, the present invention makes it possible to form contact holes having a width smaller than the minimum width able to be obtained by a masking process, by forming a smoothing insulation layer over contact regions of a semiconductor device and then forming insulation layer spacers on side walls of a contact mask. In accordance with the present invention, the contact holes are provided with contact pads making the step coverage good. As the bit lines and the storage capacity electrodes are connected by means of the contact pads, it is possible to prevent problems of short circuits between word and bit lines and between and the word or bit line and a storage capacity electrode, other short circuits of lines caused by terminals, and an increase in resistance. Accordingly, there are improvements in reliability and yield of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming contacts of a highly integrated semiconductor device comprising the steps of forming over a silicon substrate an element isolation oxide film, a gate oxide film, and a plurality of MOSFETs each including gate electrodes, a source and a drain, forming a first insulation layer over the gate electrodes, removing partially the first insulation layer at its portions disposed over the sources and drains of said plurality of MOSFETs to form contact holes, and forming a conductive layer in contact with the sources and drains exposed through the contact holes, the method comprising the further step of forming miniature contacts over the sources and drains, said further step comprising the steps of:

coating a thick second insulation layer as a smoothing layer over the first insulation layer including the MOSFETs and coating over the second insulation layer a first polysilicon layer, a third insulation layer and a photoresist film, in this order;

removing the photoresist film at its portions disposed above the sources and drains to form a photoresist film pattern and etching the third insulation layer at its portions exposed through the removed portions of the photoresist film to form a third insulation layer pattern;

removing the photoresist film pattern and forming spacers of a fourth insulation layer on side walls of the third insulation layer pattern;

etching the first polysilicon layer at its portions exposed through the removed portions of the third insulation layer, under a condition of using both the third insulation layer pattern and the fourth insulation layer spacers as a mask, to form a first polysilicon layer pattern;

removing the third insulation layer pattern and the fourth insulation layer spacers, etching the second insulation layer at its portion exposed through the removed third insulation layer pattern and fourth insulation layer spacers, under a condition of using the first polysilicon layer pattern as a mask, and etching the first insulation layer at its portion exposed through the etched portions of the second insulation layer, to form contact holes through which the sources and drains are exposed;

depositing over the contact holes and the first polysilicon layer pattern a second polysilicon layer with a smooth upper surface and removing a portion of the second polysilicon layer and the first polysilicon layer pattern to form contact pads respectively connected to the sources and drains; and applying conductive layers for selected electrodes or wirings to the contact pads.

2. The method in accordance with claim 1, wherein the second and third insulation layers are comprised of oxide layers.

3. The method in accordance with claim 1, wherein the step of forming the fourth insulation layer spacers comprises the steps of coating the fourth insulation layer over the third insulation layer pattern and etching the fourth insulation layer to form the fourth insulation layer spacers on the side walls of the third insulation layer pattern.

4. The method in accordance with claim 3, wherein the fourth insulation layer is comprised of an oxide layer.

5. The method in accordance with claim 1, further comprising the steps of coating a fifth insulation layer over the entire exposed upper surface of the resultant structure obtained after the formation of the contact pads, removing portions of the fifth insulation layer to expose the contact pads therethrough, depositing a conductive layer for a bit line over the resultant entire exposed surface defined after the removal of the fifth insulation layer, and forming the bit line over and in contact with a corresponding one of the exposed contact pads by use of a mask pattern process.

6. The method in accordance with claim 5, further comprising the steps of coating a sixth insulation layer as a bit line insulating layer after the formation of the bit line, and forming storage capacity electrodes over and in contact with corresponding ones of the exposed contact pads.

* * * * *